United States Patent [19]

Brown

[11] Patent Number: 4,644,245

[45] Date of Patent: Feb. 17, 1987

[54] NICKEL-CADMIUM BATTERY STATE-OF-CHARGE MEASURING METHOD

[75] Inventor: Harry B. Brown, Falls Church, Va.

[73] Assignee: Applied Electro Mechanics, Inc., Alexandria, Va.

[21] Appl. No.: 692,982

[22] Filed: Jan. 28, 1985

[51] Int. Cl.⁴ .......................... G01N 27/46; H02J 7/00
[52] U.S. Cl. ........................................ 320/13; 320/21; 320/48; 324/429
[58] Field of Search ...................... 320/13, 14, 21, 39, 320/48; 324/429

[56] References Cited

U.S. PATENT DOCUMENTS

| | | | |
|---|---|---|---|
| 3,593,099 | 7/1971 | Scholl | 320/13 |
| 3,609,502 | 9/1971 | Burkett et al. | 320/14 X |
| 4,275,351 | 6/1981 | Harer et al. | 324/429 X |
| 4,433,295 | 2/1984 | Zaugg | 320/48 X |

Primary Examiner—R. J. Hickey
Attorney, Agent, or Firm—Nies, Webner, Kurz & Bergert

[57] ABSTRACT

The terminal voltage of nickel-cadmium battery is measured while the battery is placed under a heavy discharge load during a predetermined short interval.

2 Claims, 7 Drawing Figures

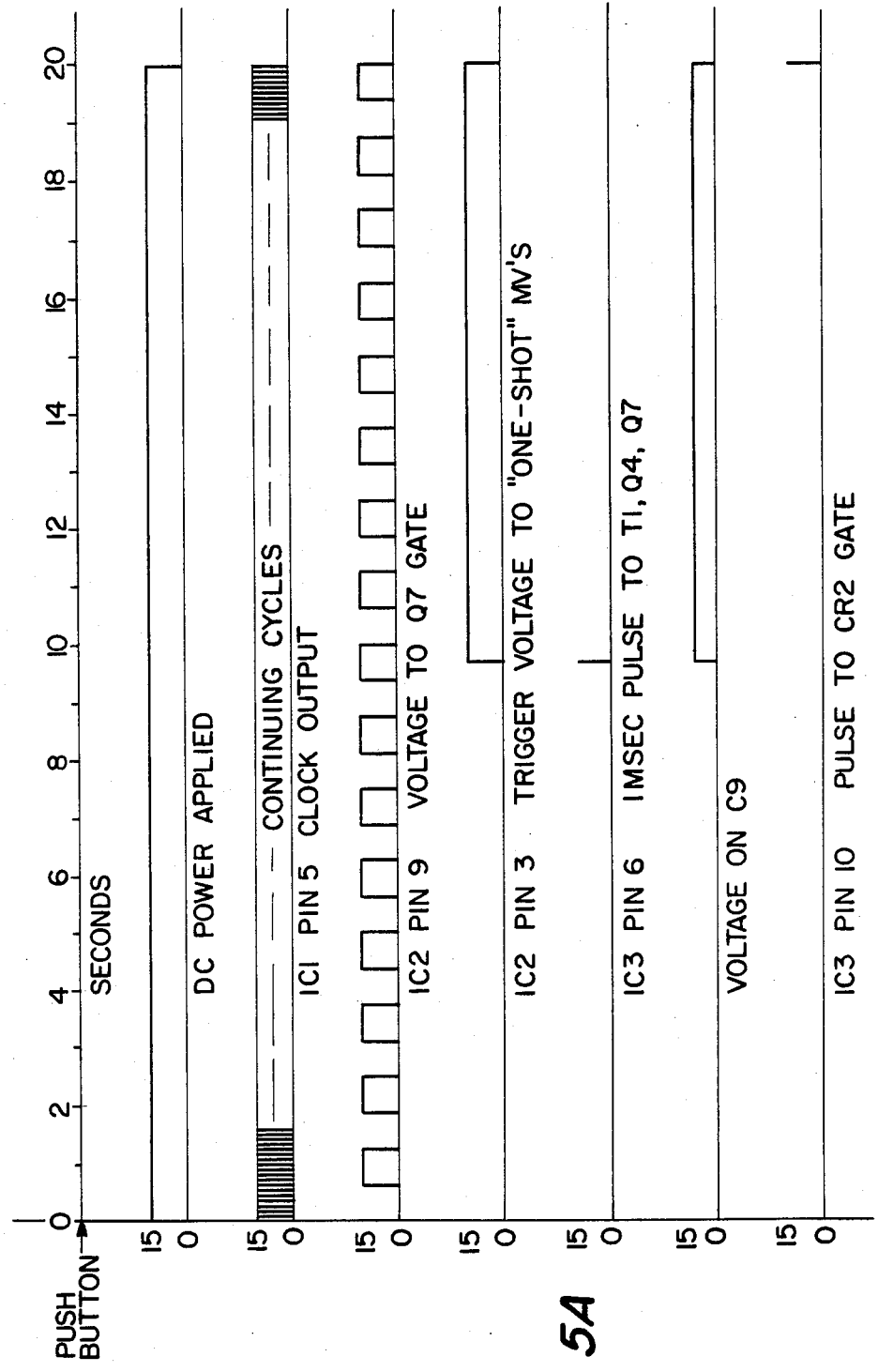

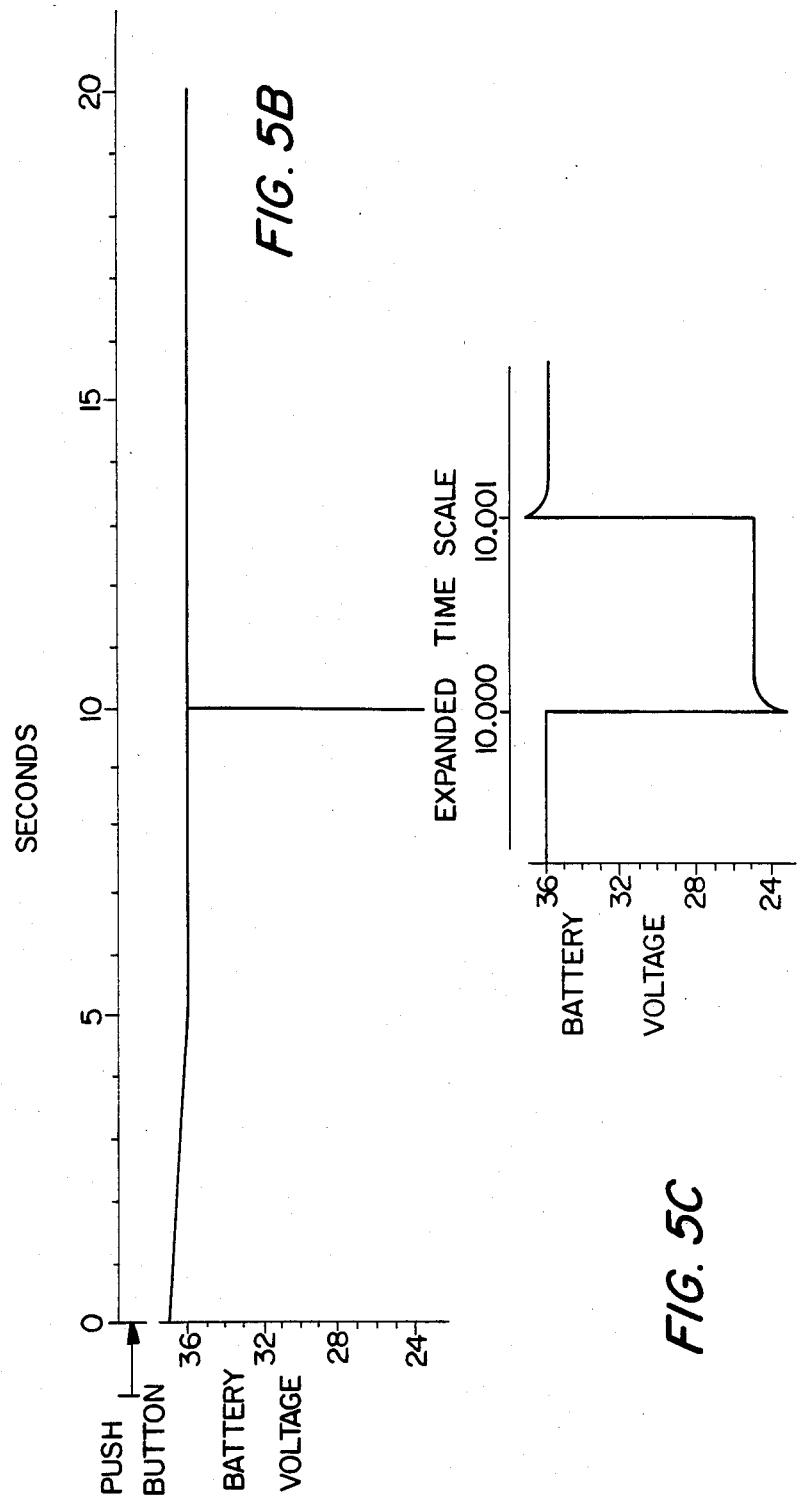

NICKEL-CADMIUM BATTERY STATE-OF-CHARGE MEASURING METHOD

BACKGROUND

Because the normal voltage curve for a nicad battery is very flat for a major portion of a discharge cycle, it is difficult to accurately assess the battery charge simply by measuring its terminal voltage. Furthermore, because the terminal voltages between a normal discharge rate of 1.4 amperes vary greatly from battery to battery, the state of charge of any given battery is likewise difficult to assess by means of terminal voltage at any given time.

FIG. 1 is a set of curves produced from a battery manufacturer's manual. The top curve represents cell voltage as current is drained from it at the "standard" rate, called the "5 hour" rate, the rate that determines the normal ampere-hour rating of the battery. As can be seen the cell voltage drops from 1.3 to 1.1 volts when the cell goes from full to final discharge state. Note the flatness of the curve for most of the 1.4 ampere discharge rate, but note also the slope of the bottom curve for a 35 ampere rate.

If a drain of 75 amperes were extracted from the battery for a short time, i.e., 1 millisecond, periodically during a normal 1.4 ampere discharge cycle, sampling of the battery voltage from its full to its empty state produces a relatively constant and steep slope curve, indicating at any time the percentage of charge left in the battery. The ampere-hour drain (loss of capacity) experienced by a battery when rated at 7 ampere-hours by a discharge of 75 amperes for one millisecond produces $$AH(\text{loss}) = 75 \times \frac{1}{1000 \times 60 \times 60} = .00002.$$

A thousand such tests would extract only about 1/5 of an ampere-hour from the battery, which is insignificant.

FIG. 2 is taken from tests upon a 10-cell nicad (nickle-cadmium) battery pack. A fully charged 7 AH battery was discharged at the 5 hour rate (1.4 amperes). One millisecond pulse tests, drawing 75 amperes each, were performed at the start and at each hour thereafter including the fifth hour. An additional reading was taken at 4.5 hours. The battery voltage taken during the one millisecond pulse is plotted on the vertical scale against the ampere-hour discharge and the steady drain on the battery was discontinued during each pulse test. The steep slope of the curve demonstrates the accurate appraisability of the discharge capacity by means of the pulse test as contrasted, for example, with the top curve of FIG. 1.

The foregoing general principals are followed in the ensuing specification in which FIG. 3 is a block diagram of the invention.

FIG. 5A is a chart of timing voltages occurring at key points in the circuit diagram of FIG. 4 during a twenty second test period.

FIG. 5B shows battery voltages during the state-of-charge measuring cycle; and,

FIG. 5C is an enlarged diagram showing the battery terminal voltage immediately prior to, during, and immediately after the one millisecond heavy discharge pulse.

Figure 1:
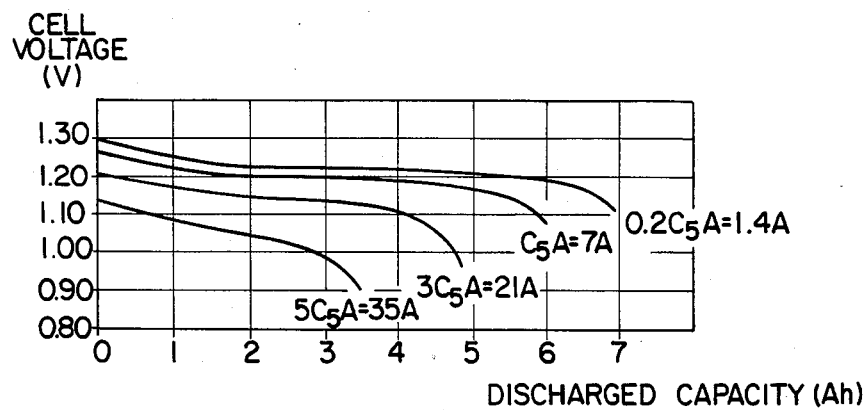
Figure 2:
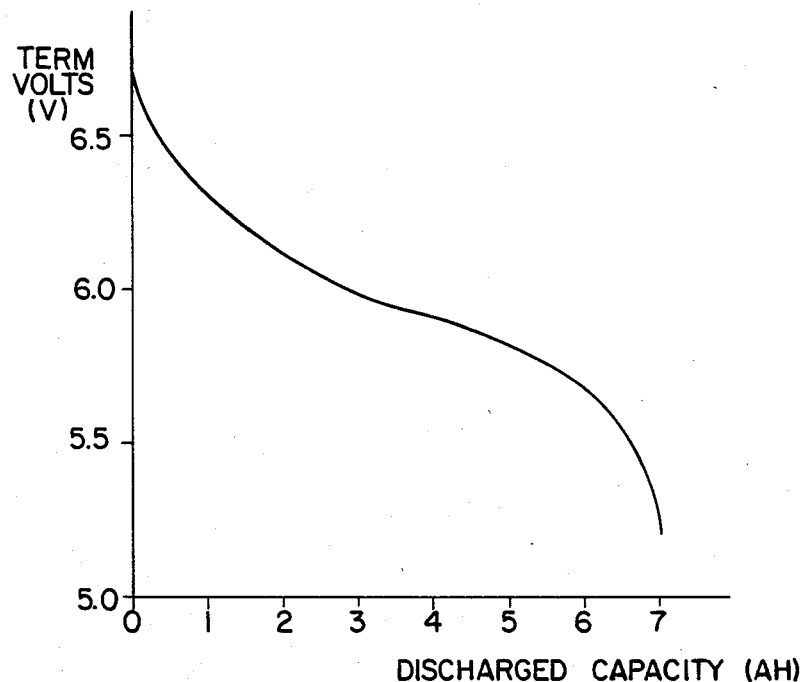
Figure 3:
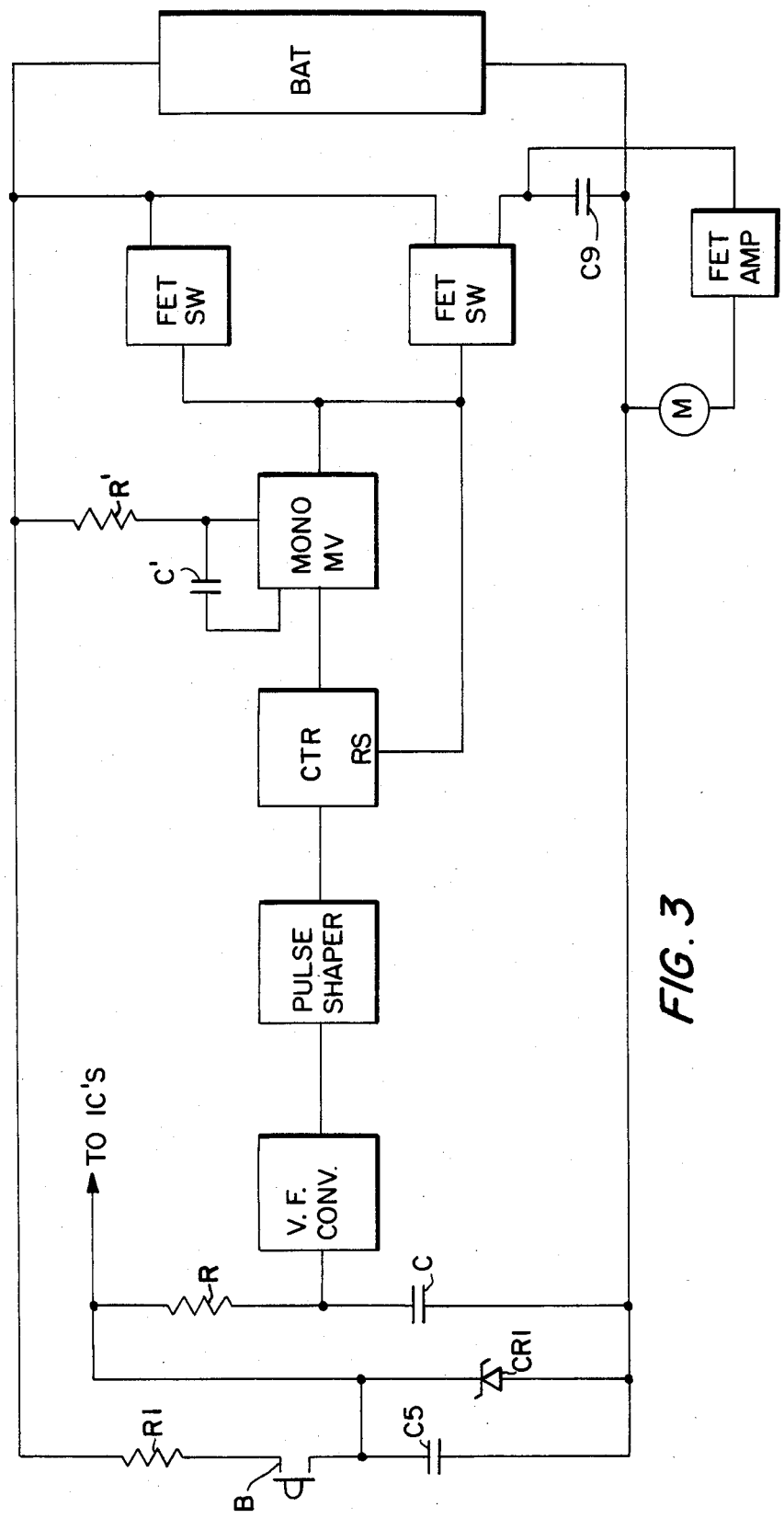

Referring first to the block diagram of FIG. 3, the over-all operation and sequence of events is as follows:

A. Button B closes switch. Battery power is applied to capacitor C5 and Zener diode CR1 through resistor R1. Charge is stored in C5 and maintained at +14 volts by CR1.

B. voltage-to-frequency converter (V.F.Conv.) generates pulses whose repetition rate is determined by a resistor R and capacitor C.

C. Pulse shaper gives pulses proper amplitude (0–14V).

D. Counter, CTR, receives pulses at "clock" input terminal and counts them to some desired number, N. At the count of N, it sends out a pulse.

E. A mono-stable multivibrator, MONO MV, is triggered by the input pulse and generates a single pulse the duration of which is determined by a resistor R' capacitor C', shown. This single pulse performs three functions. One is to reset the counter to zero. Functions two and three are described in F and G.

F. The gate of a field-effect-transistor, FET SW, is actuated by the incoming pulse turning the FET to "ON" for the pulse duration. The FET, connected across the battery terminals through a very small resistor, allows a very large current to flow from the battery. This large current of very short duration is called the "discharge pulse".

G. A second field-effect-transistor, FET SW, acts also as a switch. Instead of allowing a large current to flow, however, the second FET charges a capacitor C9 to equal to battery voltage which the battery was able to sustain during the discharge pulse.

H. The final act then is to read the voltage across the capacitor C9. A field-effect-amplifier, FET AMP is coupled to the capacitor. Because the FET has a very high input resistance, the capacitor voltage will decay very slowly. The meter connected to the FET AMP will therefore have ample time to respond to the capacitor voltage. The meter scale would be made to indicate directly the fraction of battery charge remaining.

Figure 4:
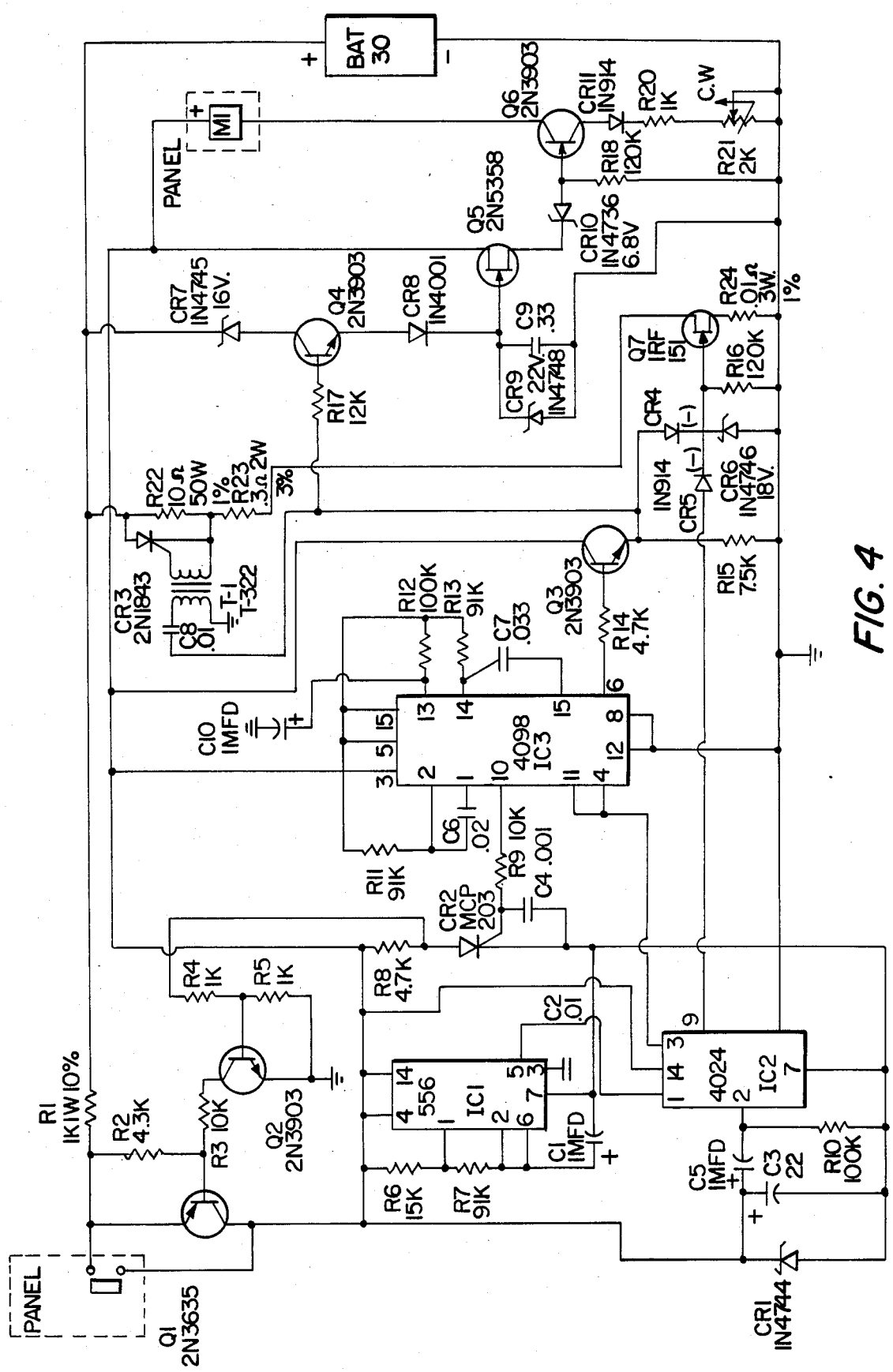
FIG. 4 is a circuit diagram of an apparatus incorporating the invention.

Referring now to the circuit diagram of FIG. 4:

Generating clock pulses is the function of IC1. These pulses are timed approximately by the values of R6, R7, and C1. The output pulses of IC1 from pin 5 are sufficient to operate the counter action of IC2 when applied to its pin 1. IC2 has a second input, applied at its pin 2 is a positive voltage momentarily present when the supply voltage is first turned on. This voltage applied from CR1 thru C5 sets the counter to zero at the beginning of the operation. Once the momentary voltage has been applied, the voltage on its pin 2 goes to zero by the action of R10.

The counter, IC2 has two outputs appearing on pins 9 and 3. Output on pin 9 cycles in 1.25 seconds and the output on pin 3 cycles in 20 seconds. Due to these two outputs, three separate actions ensue.

The shortest action from pin 9 will be explained hereinafter. The main action due to the 20 second cycle is shown in the block diagram. At the 10 second point it goes high and fires the "one-shot" (IC3) shown in the circuit diagram. This results in the switching actions which cause the meter to read.

At the end of the 20 second cycle, the voltage on pin 3 of IC2 goes low, firing a second "one-shot" IC3 which fires CR2 and the operation is to turn Off Q2 which turns off Q1.

The two separate actions resulting from the voltage on pin 3 of IC2 is made possible by the dual identical but separate circuits in IC3, one responding to a low-to-high (pos.) trigger, the second to a high-to-low (neg.) trigger. Pin 3 of IC2 goes high at 10 seconds and completes the cycle by going low at 20 seconds.

The 10 second timed pulse appears on pin 6 of IC3 and is about 1 millisecond long (0.001 second). This pulse is given greater clout by the power gain of Q3.

As indicated in the block diagram, the "main" pulse has two functions, to switch on-and-off a battery current (50 to 80 amperes in subject equipment) and to switch on-and-off a voltmeter that can measure the battery voltage during the high current. This voltage, taken during the extreme loading of the battery, is the key to estimating the amount of charge remaining in the battery.

As applied to the circuit diagram, the main switch for producing the heavy battery discharge current is the transistor, Q7. Transistor, Q7, is a "field effect" type. It is driven to conduction by the action of the positive pulse at the emitter of Q3 applied thru CR4. Voltmeter switching results from the same emitter voltage acting on Q4 thru resistor R17.

Referring to the block diagram once again, the next block stores the voltage, and this function is performed by capacitor, C9, charged during the conduction period of Q4 by the current path from the battery thru CR7, Q4 collector to emitter, and CR8. To transfer the stored voltage on C9 to a meter reading on M1, a second field-effect transistor Q5 produces a forward bias on Q6 thru CR10, the amount of bias directly determining the current thru M1, the meter which indicates the state of charge.

The foregoing completes the parallel relations between the block diagram and circuit diagram. However, one major and several minor details need additional clarification.

As noted earlier, IC2 had a second output. Specifically, pin 9 provides a square wave output of 1.25 second per cycle. This output directly couples to the main switch transistor, Q7, and therefore switches it on and off at the 1.25 second per cycle rate. This action starts when power is applied and lasts until power is removed.

The current which flows during this time comes from the battery, thru R22, R23, Q7, and R24. The purpose of this current flow is to deplete a superficial charge that forms when a nickle cadmium battery stands idle or has been recently charged. It results in a small voltage drop when battery current first flows. This is represented by the declining voltages during the first five seconds of the cycle, FIG. 5B, until it levels off prior to the pulse discharge. The one millisecond pulse from IC3 and Q3 also applies to T1 primary thru C8. Transformer T1 transfers a sharp positive voltage to CR3 gate causing CR3 to fire and become conducting. In the conducting state, CR3 effectively shorts out resistor R22, allowing the 50 to 80 ampere current pulse to flow thru a low impedance path during the one millisecond interval.

Both Q7 and Q5 are protected with zener diodes CR6 and Cr9 respectively. Both transistors are FET types and are easily damaged by transient static disturbance. Two zener diodes CR7 and CR10, and to a lesser extent CR8 and CR11, convert the battery voltage to lower values which are more readily handled in the measurement circuit.

The invention is most useful for quickly showing the state of charge of a nickel-cadmium battery in meter readings which are sufficiently accurate for a user who neither knows nor cares about the history or characteristics of a particular battery to judge whether it should or should not be re-charged. If the meter denotes a charge of, for example, 24 or 25 volts at the end of the 1 millisecond pulse discharge the charge is satisfactory. If, however, it reads 20 volts, the battery needs recharging.

I claim:

1. A method of determining the state of charge of a nickel-cadmium battery, which comprises
    discharging the battery through a low impedance path at the rate of about 50 to 80 amperes for a pulse discharge period of about one millisecond,
    measuring the highest battery terminal voltage sustained during the major portion of the discharge period,
    wherein the battery terminal voltage is stored in a capacitor which is connected across a battery current path concurrently with the pulse discharge period, and wherein the charge remaining in the capacitor is measured subsequent to the termination of the discharge period,
    wherein the low impedance path includes a resistor of relatively low impedance and wherein the high impedance path includes a resistor of relatively high impedance,
    wherein said reisistors are in parallel to the battery throughout the pulse discharge period and for time intervals preceding the pulse discharge period, further including the step of shorting out the high impedance resistor throughout the pulse discharge period.

2. The method claimed in claim, 1 wherein the battery terminal voltage is measured by connecting the capacitor across the battery terminals no sooner than a first portion of the pulse discharge period and disconnecting the capacitor from across the battery terminals no later than the end of the pulse discharge period.

* * * * *